(12) United States Patent
Tai et al.

(10) Patent No.: US 11,133,200 B2
(45) Date of Patent: Sep. 28, 2021

(54) SUBSTRATE VAPOR DRYING APPARATUS AND METHOD

(71) Applicant: Taiwan Semiconductor Manufacturing Co., Ltd., Hsinchu (TW)

(72) Inventors: Chun-Liang Tai, Hsinchu (TW); Chun-Hsiang Fan, Hsinchu (TW); Kuo-Bin Huang, Jhubei (TW); Ming-Hsi Yeh, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 525 days.

(21) Appl. No.: 15/797,676

(22) Filed: Oct. 30, 2017

(65) Prior Publication Data

US 2019/0131145 A1    May 2, 2019

(51) Int. Cl.
| | |
|---|---|
| *H01L 21/67* | (2006.01) |
| *B05D 1/00* | (2006.01) |
| *B05D 3/00* | (2006.01) |
| *B08B 3/10* | (2006.01) |
| *H01L 21/02* | (2006.01) |
| *H01L 21/687* | (2006.01) |
| *B05B 3/02* | (2006.01) |

(52) U.S. Cl.
CPC .......... *H01L 21/67051* (2013.01); *B05B 3/02* (2013.01); *B05D 1/002* (2013.01); *B05D 3/007* (2013.01); *B08B 3/10* (2013.01); *H01L 21/02057* (2013.01); *H01L 21/67034* (2013.01); *H01L 21/67103* (2013.01); *H01L 21/68728* (2013.01); *H01L 21/68735* (2013.01); *H01L 21/68742* (2013.01)

(58) Field of Classification Search
CPC .......... B05B 3/02; B05D 1/002; B05D 3/007; B08B 3/10; H01L 21/02057; H01L 21/67034; H01L 21/67051; H01L 21/67103; H01L 21/68728; H01L 21/68735; H01L 21/68742; H01L 21/6875
See application file for complete search history.

(56) References Cited

U.S. PATENT DOCUMENTS

| | | | | | |
|---|---|---|---|---|---|
| 4,788,994 | A | * | 12/1988 | Shinbara | .......... H01L 21/68792 134/157 |
| 6,062,852 | A | * | 5/2000 | Kawamoto | ....... H01L 21/67109 432/258 |

(Continued)

FOREIGN PATENT DOCUMENTS

| | | |
|---|---|---|
| CN | 106024688 A | 10/2016 |
| EP | 1253633 A2 | 10/2002 |

(Continued)

OTHER PUBLICATIONS

Machine translation of JP2013-207272A (Year: 2013).*

*Primary Examiner* — Douglas Lee
(74) *Attorney, Agent, or Firm* — Slater Matsd, LLP

(57) ABSTRACT

A method of processing a semiconductor substrate is provided. The semiconductor substrate may be placed on a spin chuck with a plurality of holding members, each holding member including a pin having a sloped portion to provide a gap between an upper edge of the substrate and the pin. Thereafter, one or more treatment fluids may be dispensed over the substrate.

20 Claims, 13 Drawing Sheets

(56) References Cited

U.S. PATENT DOCUMENTS

| | | |
|---|---|---|
| 6,435,200 B1 | 8/2002 | Langen |
| 6,708,701 B2 * | 3/2004 | Emami ................. B08B 3/02 |
| | | 134/148 |
| 2005/0076531 A1 | 4/2005 | Smith et al. |
| 2006/0281310 A1 | 12/2006 | Smith et al. |
| 2010/0059478 A1 * | 3/2010 | Lee ................ H01L 21/68735 |
| | | 216/71 |
| 2010/0071624 A1 * | 3/2010 | Lee ................ H01L 21/68735 |
| | | 118/729 |
| 2012/0145204 A1 * | 6/2012 | Lin ................. H01L 21/67051 |
| | | 134/140 |
| 2013/0154203 A1 * | 6/2013 | Tschinderle ...... H01L 21/68785 |
| | | 279/33 |
| 2014/0053869 A1 | 2/2014 | Chen et al. |
| 2014/0097175 A1 | 4/2014 | Yu et al. |
| 2014/0159243 A1 | 6/2014 | Huang et al. |
| 2014/0299166 A1 | 10/2014 | Furuya et al. |
| 2014/0331927 A1 | 11/2014 | Nakano et al. |
| 2015/0270146 A1 * | 9/2015 | Yoshihara ......... H01L 21/67103 |
| | | 134/18 |
| 2015/0279708 A1 | 10/2015 | Kobayashi et al. |
| 2016/0284585 A1 * | 9/2016 | Kobayashi ........ H01L 21/67742 |
| 2017/0040189 A1 | 2/2017 | Watanabe et al. |
| 2017/0186599 A1 | 6/2017 | Takahashi et al. |

FOREIGN PATENT DOCUMENTS

| | | | |
|---|---|---|---|
| JP | 2013207272 A | * | 10/2013 |
| JP | 2013207272 A | | 10/2013 |
| KR | 20070118205 A | | 12/2007 |
| KR | 100979329 B1 | | 8/2010 |

* cited by examiner

SUBSTRATE VAPOR DRYING APPARATUS AND METHOD

BACKGROUND

The semiconductor integrated circuit (IC) industry has experienced rapid growth. Technological advances in IC materials and design have produced device scaling in which IC geometry size, such as decreasing feature size and pitch, is reduced. For example, the lateral dimensions of holes, trenches, gaps, or other features that extend downwardly into a substrate or into a film or films formed over a substrate, continue to shrink. Advanced processing techniques allow for these holes, trenches, or gaps with shrinking lateral dimensions to be formed deeper and deeper into substrates or film or films formed above the substrates. As such, the aspect ratio continues to become greater.

Along with decreasing geometry size, ICs have increased in complexity. As the semiconductor industry has progressed into nanometer technology process nodes in pursuit of higher device density and better performance, three-dimensional designs, such as fin field effect transistor (FinFET) devices, have been introduced. One type of FinFET device is fabricated with multiple fin-like structures extending vertically from a surface of a substrate. These fin-like structures are separated from each other by a shallow trench isolation (STI) region. Each of the fin-like structures has source/drain regions and a channel region formed between the source and drain regions. A gate is wrapped around the channel region of each fin-like structure, allowing better control of current flow from three sides of the channel region.

Cleaning and drying of features are used to manufacture advanced ICs. For example, the bottom of holes, trenches, and gaps are cleaned and dried to remove undesirable residue or debris. In some instances, a wet solvent that is used in cleaning may not be able to completely flow into and out of features of advanced ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
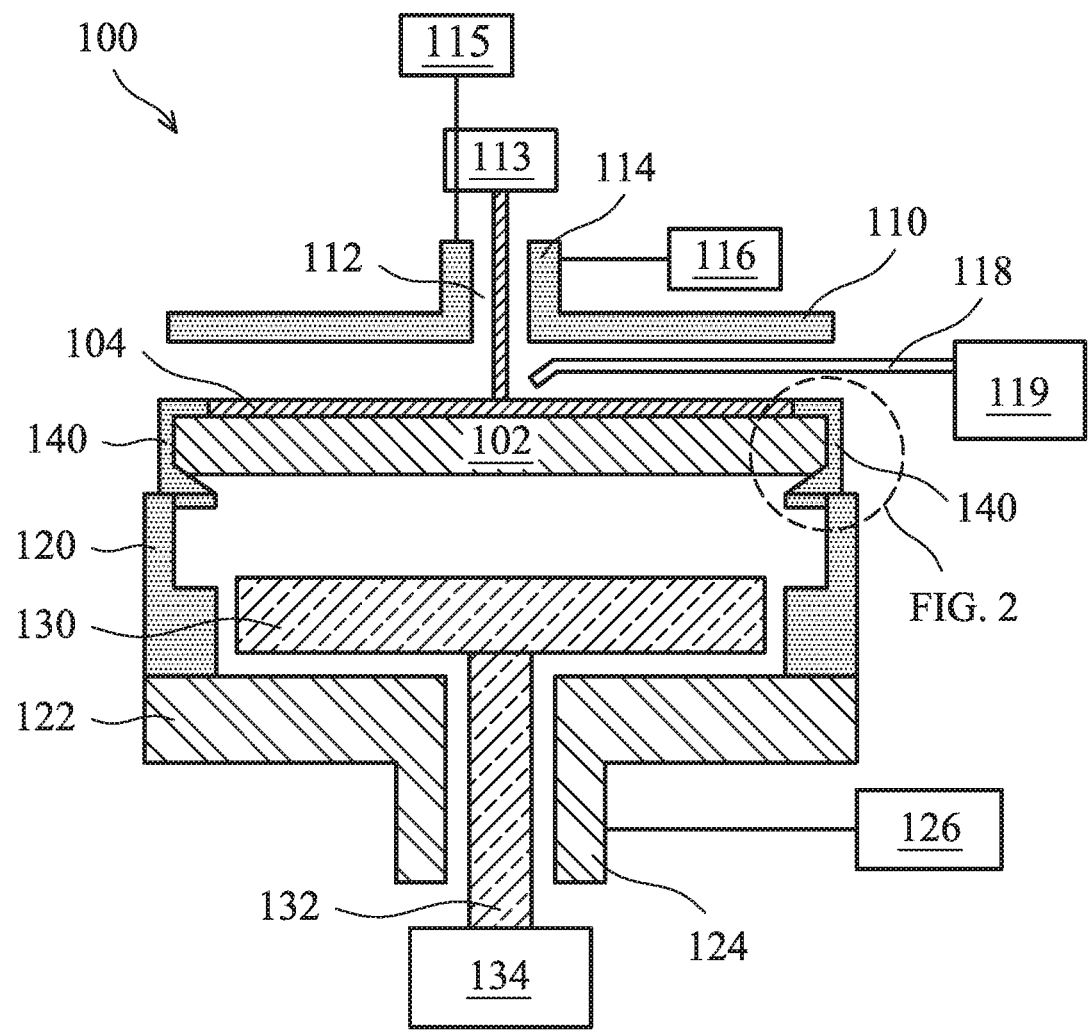
FIG. 1 is a schematic diagram of a side cross-sectional view illustrating one embodiment of a substrate processing apparatus to treat a substrate with a treatment fluid, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein provide a holding member to hold a substrate with a treatment fluid dispensed over the substrate. The holding members hold the substrate while permitting more uniformity in the thickness of the treatment fluid dispensed over the substrate. The treatment fluid dispensed over the substrate may be removed by heating the substrate to vaporize the treatment fluid.

FIG. 1 is a schematic diagram of a side cross-sectional view illustrating one embodiment of a substrate processing apparatus 100 to treat, such as cleaning and/or drying, a substrate 102 with a treatment fluid 104, including applying one or more fluids to the substrate 102. The substrate 102 may be a semiconductor substrate, such as silicon, germanium, silicon germanium, silicon carbide, gallium arsenide, indium arsenide, indium phosphide, and/or other suitable materials. The substrate may be a non-semiconductor substrate such as glass, silica, quartz, alumina, sapphire, aluminum nitride, and/or other suitable materials. The substrate may be a silicon-on-insulator (SOI) substrate. The substrate may include a plurality of layers (such as conductive layers, semiconductive layers, insulating layers, and other suitable layers) and/or features (doped regions or wells, fins, source/drain regions, isolation regions, shallow trench isolation (STI) feature, gate structures, interconnect lines, vias, and other suitable features) formed in, on, and/or over the substrate. The plurality of layers and/or features are used in the fabrication of semiconductor devices and integrated circuits. The substrate may also include subsequent materials formed in, on, and/or over the substrate in the blocks of the methods and in the figures as described herein. The substrate 102 may be a wafer, for example, having any diameter, such as 18 inches, 12 inches, 8 inches, etc.

The substrate processing apparatus 100 includes a spin chuck 120 to hold the substrate 102 in a substrate clamped position and in a substrate unclamped position. The substrate processing apparatus 100 further includes a treatment fluid delivery apparatus, such as a circular plate 110 and/or nozzle arm 118, positioned above the substrate 102 loaded on the spin chuck 120. The circular plate 110 may include one or more channels 112 coupled to a channel treatment fluid source 113 to provide a treatment fluid 104, such as a liquid, gas, or combinations thereof, to the substrate 102. As shown in FIG. 1, the circular plate 110 may be sized to a diameter similar to the substrate 102 to confine the treatment fluid between the circular plate 110 and the substrate 102. In other embodiments, the circular plate 110 may be sized smaller than the substrate 102.

The circular plate 110 is attached to a shaft 114. The shaft may be hollow to accommodate the one or more channels 112. The shaft 114 of the circular plate 110 is coupled to a lift mechanism 115 to move the circular plate up and down to provide relative motion between the circular plate 110 and the spin chuck 120 and to control the distance between the substrate 102 loaded on the spin chuck 120 and the circular plate 110. In other embodiments, the spin chuck 120 may move up and down to provide relative motion between the circular plate 110 and the spin chuck 120 or both the circular plate 110 and the spin chuck 120 may move up and down. The shaft 114 may be coupled to a rotational driving mechanism 116 to rotate the circular plate 110 in a clockwise direction and/or a counter-clockwise direction at a desired rotational speed.

The treatment fluid delivery apparatus of the substrate processing apparatus 100 may include one or more nozzle arms 118 coupled to nozzle treatment fluid source 119 to provide a treatment fluid, such as a liquid, gas, or combinations thereof, to the substrate 102. The treatment fluid delivery apparatus of the substrate processing apparatus 100 may include the one or more nozzle arms 118 in addition to or alternatively to the one or more channels 112 of the circular plate 110. For example, in one embodiment, the nozzle arm 118 may provide a first treatment fluid, such as de-ionized water, to the substrate 102 and the channel 112 may provide a second treatment fluid, such as isopropyl alcohol (IPA), to the substrate 102. In another embodiment, a first nozzle arm may provide a first treatment fluid, such as de-ionized water, to the substrate 102 and a second nozzle arm may provide a second treatment fluid, such as isopropyl alcohol (IPA), to the substrate 102. In yet another embodiment, a first channel of the circular plate 110 may provide a first treatment fluid, such as de-ionized water, to the substrate 102 and a second channel of the circular plate 110 may provide a second treatment fluid, such as isopropyl alcohol (IPA), to the substrate 102.

The spin chuck 120 includes a plurality of holding members 140 coupled to a spin base 122. The holding members 140 hold the substrate 102 in a substrate clamped position and in a substrate unclamped position. The spin base 122 is attached to a shaft 124 coupled to a rotational driving mechanism 126. The rotational driving mechanism 126 rotates the spin chuck 120 and the substrate 102 loaded on the spin chuck 120 in a clockwise direction and/or a counter-clockwise direction at a desired rotational speed.

The spin chuck 120 includes a heater 130. The heater 130 includes an embedded heating element, such as a resistive heating element or heating control fluid, to heat the heater 130 to a desired temperature. The heater 130 is coupled to a shaft 132. The shaft 132 is coupled to a lift mechanism 134 to provide relative motion between the heater 130 and the substrate 102 loaded on the spin chuck 120. In certain aspects, the lift mechanism 134 may move the heater 130 to contact the substrate 102 and to move the heater 130 away from the substrate 102 to control heating of the substrate 102 loaded on the spin chuck 120. In certain aspects, the lift mechanism 134 may move the heater 130 away from the substrate 102 to allow rotation of the spin base 122 and the holding members 140 holding a substrate 102 in a substrate clamped position.

In other embodiments, the spin base may be coupled to a lift mechanism to provide relative motion between the heater 130 and the substrate 102 loaded on the spin chuck 120. In other embodiments, other types of heaters are possible. For example, a temperature control fluid may be directly sprayed or provided to the opposite side of the substrate 102 facing away from the circular plate 110. In other embodiments, heating lamps may be directed at the substrate 102 to providing heating of the substrate 102 loaded on the spin chuck 120.

Figure 2A:
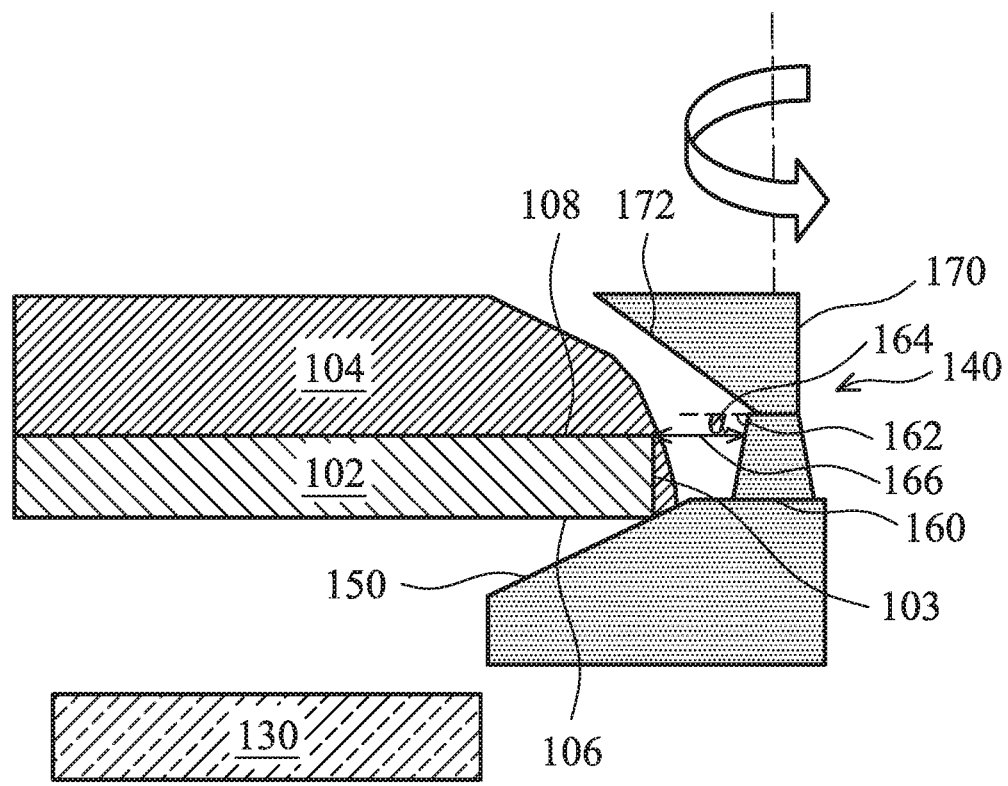
FIGS. 2A and 2B are schematic diagrams of respective side cross-sectional views of the holding member of FIG. 1, in accordance with some embodiments.
Figure 2B:
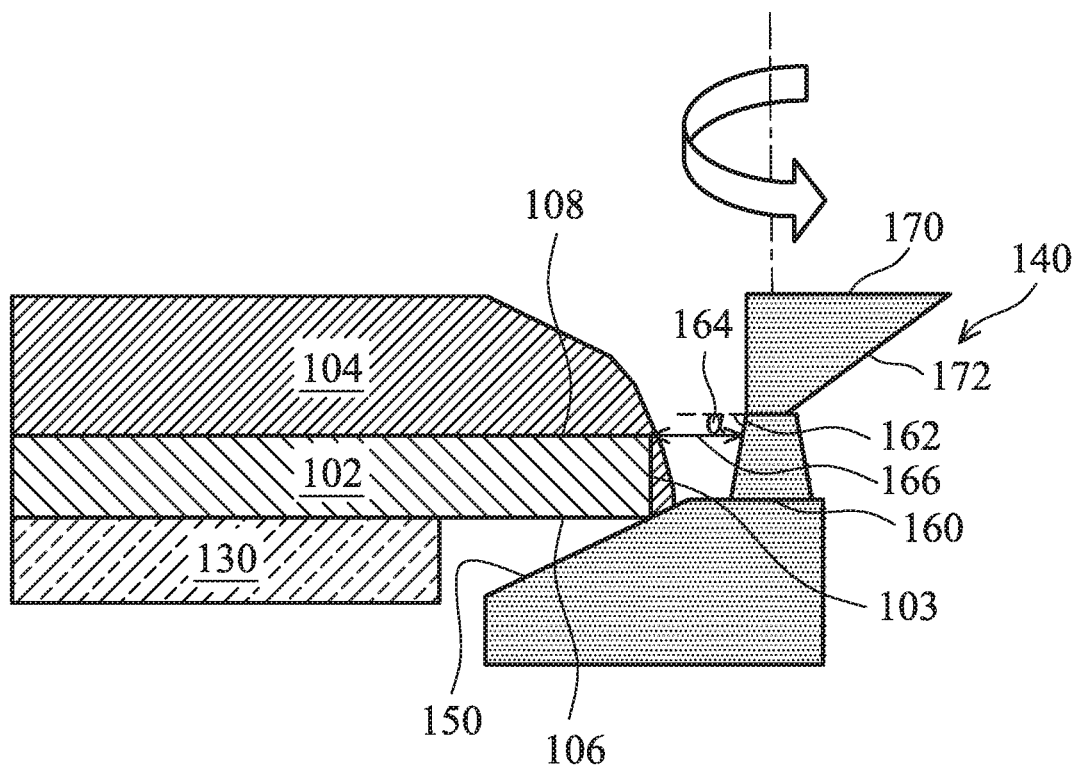

FIGS. 2A and 2B are schematic diagrams of side cross-sectional views of one embodiment of the holding member 140 of FIG. 1. The holding member 140 includes a support portion 150 to support the bottom edge 106 of the substrate 102. The support portion 150 may be angled (as shown) or may be flat. The holding member 140 includes a pin 160 supporting a holding clamp 170.

FIG. 2A shows the holding member 140 actuated in a substrate clamped position by positioning the holding clamp 170 towards the substrate 102 by rotating the pin 160. A clamping portion 172 of the holding clamp 170 contacts or is proximate to an upper edge 108 of the substrate 102 to clamp the substrate 102. In a substrate clamped position, the substrate 102 may be rotated by the holding members 140 coupled to the spin base 122 at a desired speed. The heater 130 may be positioned away from the substrate 102 to avoid contact with the substrate 102 during rotation of the substrate 102. In other aspects, while in a substrate clamped position, the substrate 102 may be processed in other steps, such as other fluid treatment steps and/or heating steps.

FIG. 2B shows the holding member 140 actuated in a substrate unclamped position by positioning the holding clamp 170 away from the substrate 102 by rotating the pin 160. A clamping portion 172 of the holding clamp 170 is away from the upper edge 108 of the substrate 102. As shown in FIG. 2B, the heater 130 may be raised to contact the substrate 102 to heat the substrate 102. In other aspects, while in a substrate unclamped position, the substrate 102 may be processed in other steps, such as other fluid treatment steps, and may be loaded and unloaded onto the holding member 140.

As shown in FIGS. 2A and 2B, the pin 160 of the holding member 140 includes a sloped portion 162 to provide a gap 166 between an upper edge 108 of the substrate 102 and the pin 160. In certain embodiments, the angle 164 of the sloped portion 162 is in a range from about 45 degrees to about 89 degrees. In other embodiments, the angle 164 of the sloped portion is in a range from about 50 degrees to about 80 degrees. The sloped portion 162 of the pin 160 faces a side edge 103 of the substrate 102 in a substrate clamped position and in a substrate unclamped position. The sloped portion 162 of the holding member 140 improves the thickness of the treatment fluid 104, such as IPA, at the upper edge 108 of the substrate 102 near the holding member 140.

Without being bound by theory unless specifically set forth in the claims, it is believed that the sloped portion 162 reduces or eliminates capillary action of the treatment fluid 104 into the gap 166 formed between the pin 160 and the upper edge 108 of substrate 102. It is believed that the capillary action may pull the treatment fluid 104 into the gap 166 which may thin the treatment fluid at the upper edge 108 of the substrate 102 proximate to the holding members 140. A reduced amount of treatment fluid at the upper edge 108 of the substrate may reduce the function of the treatment fluid, such as IPA drying of the substrate 102. With reduced IPA drying, water residues and particles may remain on the substrate 102 resulting in particle defects. Also, reduced IPA drying may result in pattern collapse of features formed on the substrate 102. The sloped portion 162 of the pin 160 enlarges the gap 166 between the substrate 102 and the pin 160 to reduce the thinning of the treatment fluid at the upper edge 108 of the substrate 102 caused by capillary action pulling the treatment fluid 104 into the gap 166. The sloped portion 162 of the pins 160 of the holding members provides increased process uniformity, such as cleaning and drying uniformity, of the treatment fluid 104.

Figure 2C:
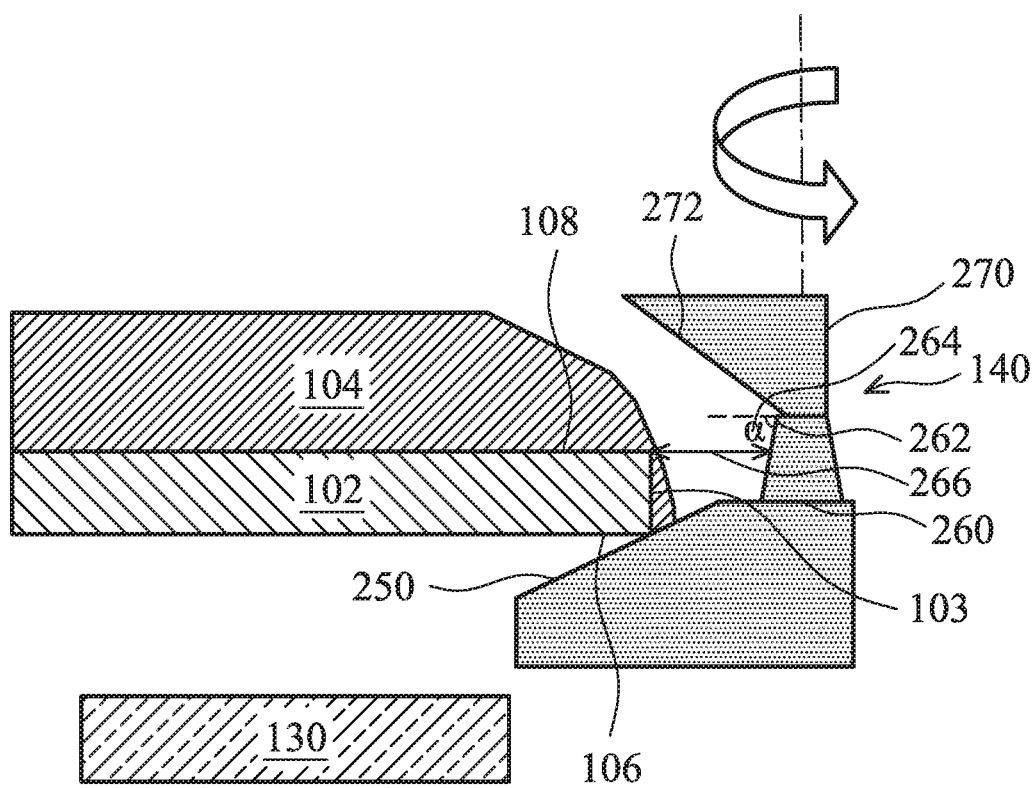
FIGS. 2C and 2D are schematic diagrams of respective side cross-sectional views of another holding member of FIG. 1, in accordance with some embodiments.
Figure 2D:
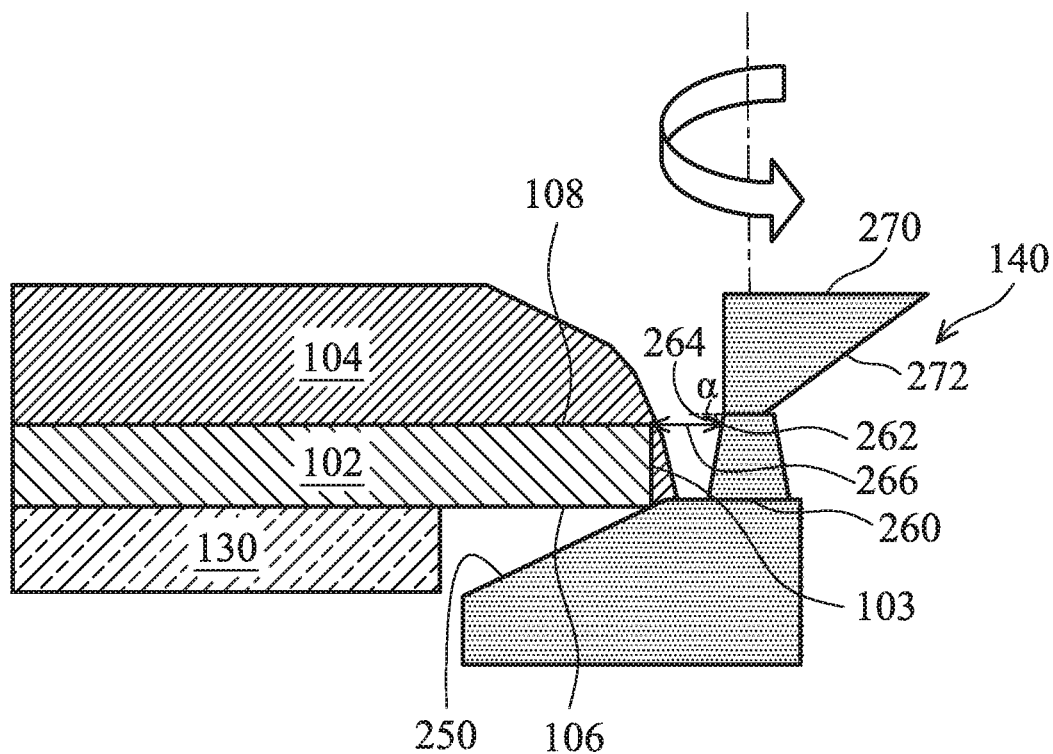

FIGS. 2C and 2D are schematic diagrams of side cross-sectional views of another embodiment of the holding member 140 of FIG. 1. The holding member 140 includes a support portion 250 to support the bottom edge 106 of the substrate 102. The support portion 250 may be angled (as shown) or may be flat. The holding member 140 includes a pin 260 supporting a holding clamp 270. The holding clamp 270 rotates between a substrate clamped position and a substrate unclamped position while the pin 260 remains stationary relative to rotation of the holding clamp 270.

FIG. 2C shows the holding member 140 actuated in a substrate clamped position by rotating the holding clamp 270 towards the substrate 102. A clamping portion 272 of the holding clamp 270 contacts or is proximate to an upper edge 108 of the substrate 102 to clamp the substrate 102. FIG. 2D shows the holding member 140 actuated in a substrate unclamped position by rotating the holding clamp 270 away from the substrate 102. A clamping portion 272 of the holding clamp 270 is positioned away from the upper edge 108 of the substrate 102.

As shown in FIGS. 2C and 2D, the pin 260 of the holding member 140 includes a sloped portion 262 to provide a gap 266 between an upper edge 108 of the substrate 102 and the pin 260. Since the pin does not rotate, the sloped portion 262 may be provided to one side of the pin 260 facing the side edge 103 of the substrate 102 in both a substrate clamped position and in a substrate unclamped position. In certain embodiments, the angle 264 of the sloped portion 262 is between 45 degrees and 89 degrees. In other embodiments, the angle 264 of the sloped portion is between 50 degrees and 80 degrees. The sloped portion 262 of the holding member 140 improves the thickness of the treatment fluid 104, such as IPA, at the upper edge 108 of the substrate 102 near the holding member 140.

Without being bound by theory unless specifically set forth in the claims, it is believed that the sloped portion 262 reduces or eliminates capillary action of the treatment fluid 104 into the gap 266 formed between the pin 260 and the upper edge 108 of substrate 102. It is believed that the capillary action may pull the treatment fluid 104 into the gap 266 which may thin the treatment fluid at the upper edge 108 of the substrate 102 proximate to the holding members 140. A reduced amount of treatment fluid at the upper edge 108 of the substrate may reduce the function of the treatment fluid, such as IPA drying of the substrate 102. With reduced IPA drying, water residues and particles may remain on the substrate 102 resulting in particle defects. Also, reduced IPA drying may result in pattern collapse of features formed on the substrate 102. The sloped portion 262 of the pin 260 enlarges the gap 266 between the substrate 102 and the pin 260 to reduce the thinning of the treatment fluid at the upper edge 108 of the substrate 102 caused by capillary action pulling the treatment fluid 104 into the gap 266. The sloped portion 262 of the pins 160 of the holding members provides increased process uniformity, such as cleaning and drying uniformity, of the treatment fluid 104.

In other embodiments, the sloped portion 162, 262 of pin 160, 260 may be curved to increase the size of the gap 166, 266 between the upper edge 108 of the substrate 102 and the pin 160, 260.

Figure 3A:
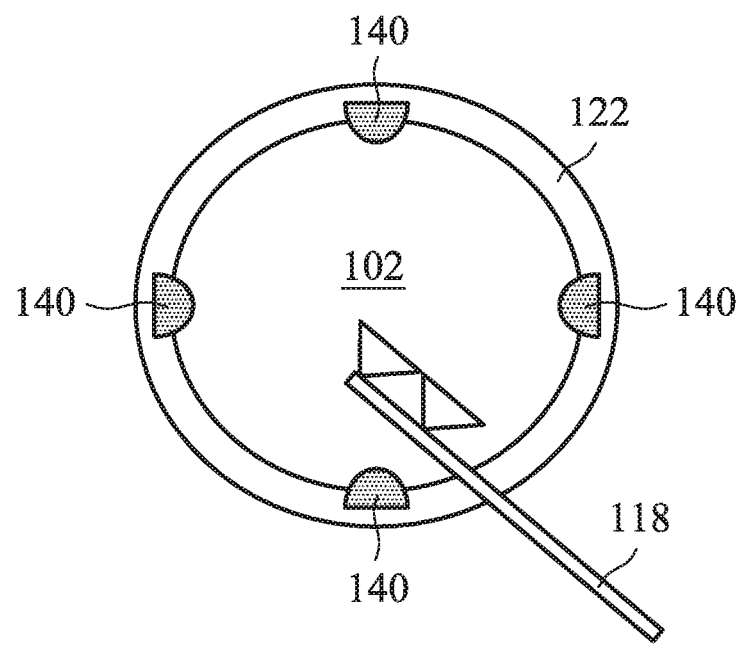
FIGS. 3A and 3B are schematic diagrams of respective top views illustrating the spin chuck of FIG. 1 and FIGS. 2A-D, in accordance with some embodiments.
Figure 3B:
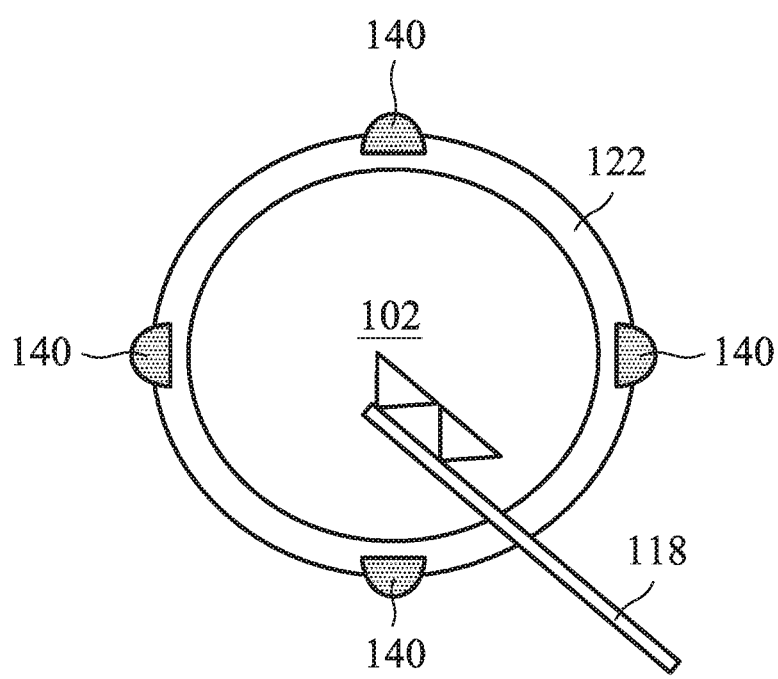

FIGS. 3A and 3B are schematic diagrams of top views illustrating one embodiment the spin chuck 120 of FIG. 1 and FIG. 2. The spin chuck 120 includes four holding members 140. In other embodiment, the spin chuck 120 may include other number of holding members 140, such as three holding members 140 or five or more holding members 140. In FIG. 3A, the holding clamps of the holding members 140 are positioned in a substrate clamped position. In FIG. 3B, the holding clamps of the holding members 140 are positioned in a substrate unclamped position.

FIGS. 3A and 3B also show one embodiment of the substrate processing apparatus with one nozzle arm 118, although there may be more than one nozzle arm 118. The nozzle arm 118 may be rotated to be positioned over any portion of the substrate 102.

Figure 4:
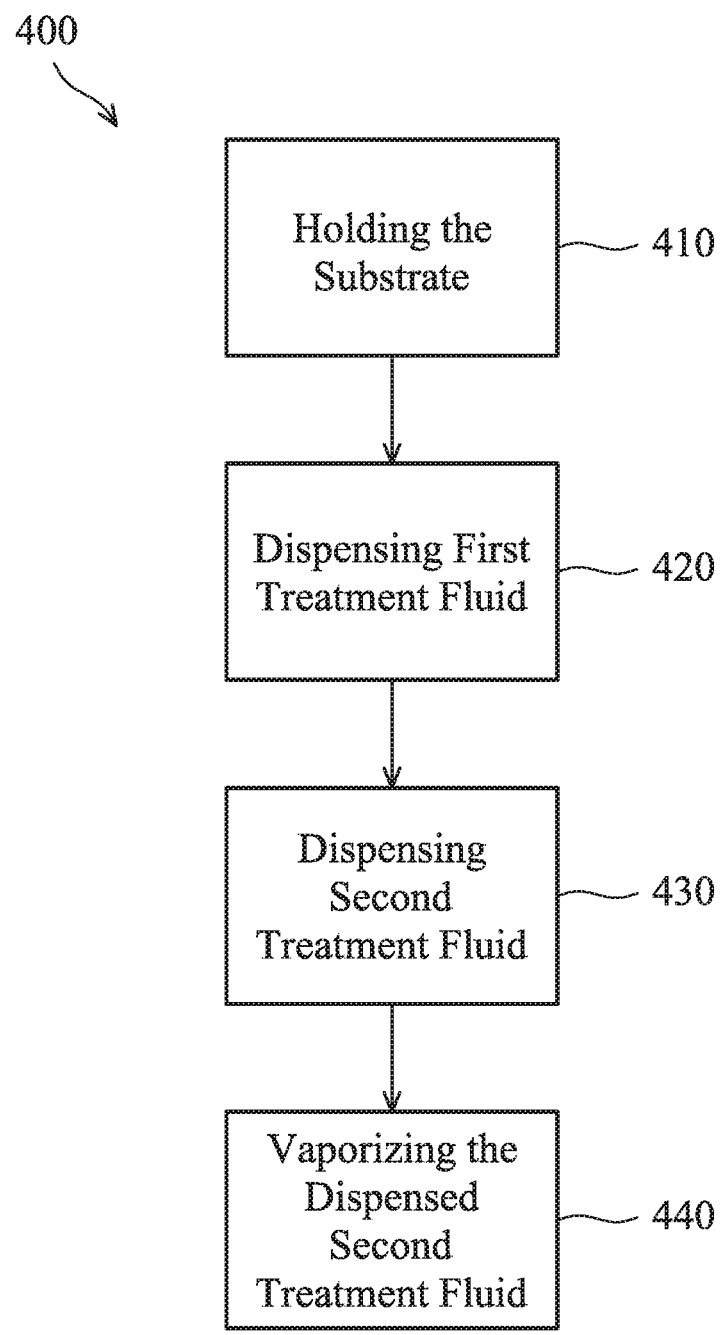
FIG. 4 is a flow diagram illustrating a method of cleaning and drying a substrate with the substrate processing apparatus of FIG. 1, in accordance with some embodiments.

FIG. 4 is a flow diagram illustrating one embodiment of a method 400 of cleaning and drying a substrate 102 with the substrate processing apparatus 100 of FIG. 1. At block 410 of the method, the substrate 102 is loaded into the substrate processing apparatus 100. The substrate 102 is held on the spin chuck 120 of the substrate processing apparatus 100 with the plurality of holding members 140. Each holding member includes the pin 160 having the sloped portion 162 to provide a gap between an upper edge of the substrate and the pin.

At block 420 of the method 400, a first treatment fluid, such as de-ionized water, is sprayed or dispensed to the substrate 102, such as through nozzle arm 118 disposed over the substrate 102. The spin chuck 120 may rotate during or after dispensing of the first treatment fluid onto the substrate 102. For example, the spin chuck 120 may rotate the substrate 102 at a speed in a range from about 300 revolutions per minute to about 3,000 revolutions per minute. In other embodiments, the spin chuck 120 may be stationary during and after dispensing the first treatment fluid onto the substrate 102.

At block 430 of the method 400, a second treatment fluid, such as isopropyl alcohol (IPA), is sprayed or dispensed to the substrate 102 through channel 112 of the circular plate 110. The second treatment fluid may be dispensed as a mixture with nitrogen gas ($N_2$) or with other fluids. The spin chuck 120 may rotate during or after dispensing the second treatment fluid onto the substrate 102. For example, the spin chuck 120 may rotate the substrate 102 at a speed in a range from about 300 revolutions per minute to about 3,000 revolutions per minute.

At block 440 of the method 400, the substrate 102 is heated to vaporize any remaining dispensed second treatment fluid, such as IPA, on the substrate to provide a clean and dry substrate 102. During at least a portion of block 420, 430, and/or 440, each holding member 140 includes a pin having a sloped portion positioned facing the side edge 103 of substrate. Without being bound by theory unless specifically set forth in the claims, the sloped portion of the pin reduces capillary action of the treatment fluid(s) dispensed at block 420 and/or block 430 and helps maintain the thickness of the treatment fluid(s) at the upper edge 108 of the substrate 102 near the holding member 140 as the treatment fluid(s) remains on the substrate 102 at block 420, 430, and 440. The method 400 provides a more uniformly cleaned and dried substrate 102 with reduced pattern collapse of features formed over the substrate.

Figure 5A:
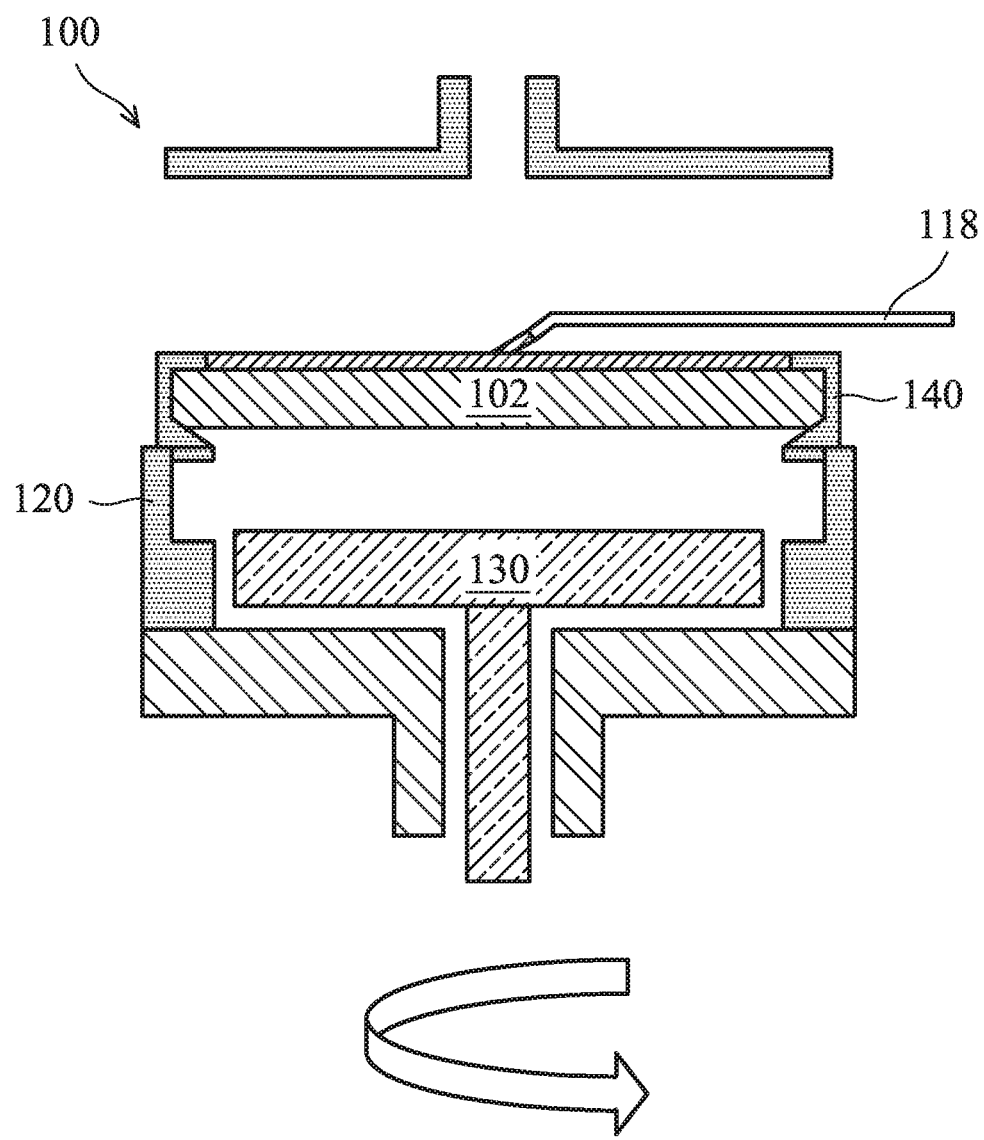
FIGS. 5A-C are schematic diagrams of side cross-sectional views of the substrate processing apparatus of FIG. 1 illustrating a method of cleaning and drying a substrate, in accordance with some embodiments.
Figure 5B:
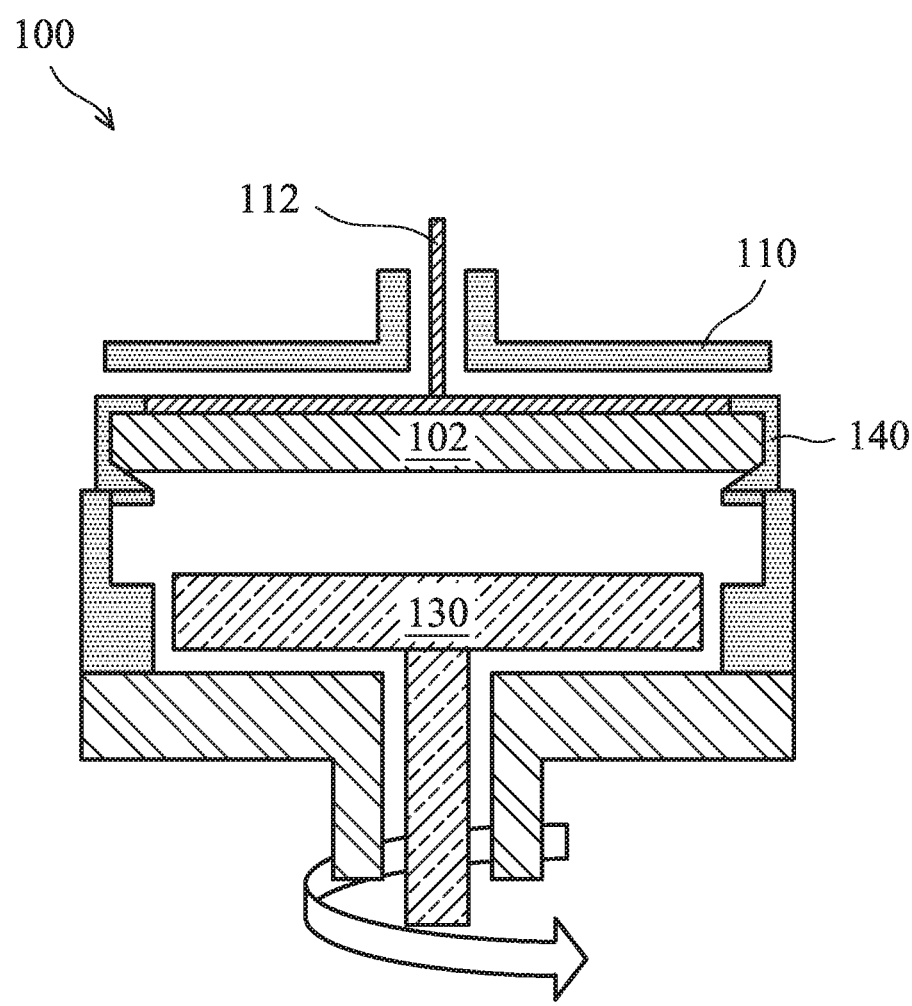
Figure 5C:
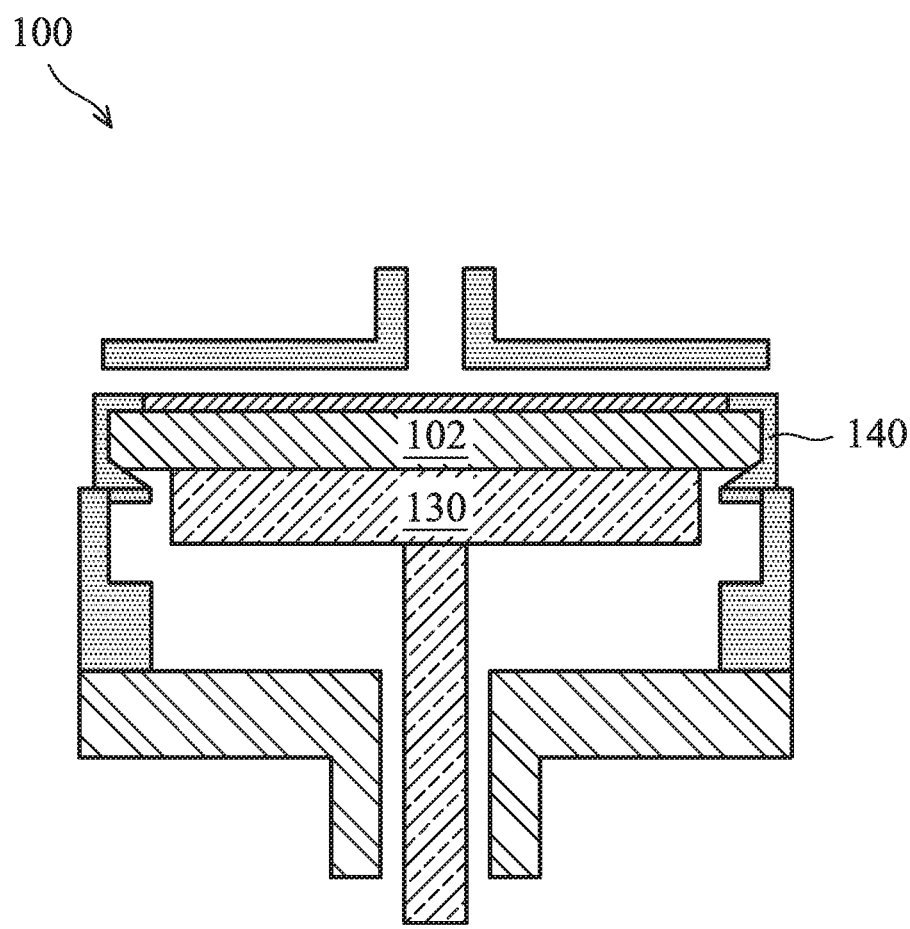

FIGS. 5A-C are schematic diagrams of side views of the substrate processing apparatus 100 of FIG. 1 illustrating one embodiment of a method of cleaning and drying a substrate 102. In FIG. 5A, a substrate 102 is loaded onto the spin chuck 120. The holding members 140 of the spin chuck 120 are engaged in a substrate clamped position to clamp the upper edge 108 of the substrate 102. De-ionized water is sprayed or dispensed on the substrate 102 through nozzle arm 118 positioned over the substrate 102. The spin base 122 may be rotated at a desired speed during or after dispensing of the de-ionized water onto the substrate 102. The heater 130 is positioned in a lower position away from the substrate 102 to allow rotation of the spin base 122, the holding members 140, and the substrate 102.

In FIG. 5B, isopropyl alcohol (IPA) is sprayed or dispensed on the substrate 102 through the channel 112 of the circular plate 110. IPA may also be sprayed or dispense as a mixture with nitrogen gas (N2). The spin base 122 may be rotated during or after dispensing of the IPA onto the substrate 102. The heater 130 may be positioned in a lower position away from the substrate 102 to allow rotation of the spin base 122, the holding members 140, and the substrate 102.

IPA provides a cleaning effect and a drying effect to the substrate 102. The cleaning and drying takes place in part by the Marangoni effect. The Marangoni effect is the mass transfer along an interface between two fluids due to a surface tension gradient. Because a fluid with a high surface tension pulls more strongly on the surrounding fluid than one with a low surface tension, the presence of a gradient in surface tension will naturally cause the fluid to flow away from regions of low surface tension.

For example, when IPA is dispensed onto the substrate 102, the de-ionized water remaining on the surface of the substrate 102 is pushed out of the features of the substrate 102 and toward a periphery of the substrate 102 due to the Marangoni effect. The IPA moves the de-ionized water laterally along the surface of the substrate 102 and expels the de-ionized water, along with particles trapped therein, off the edge of the substrate. Rotating the substrate 102 during application of the IPA or after application of the IPA may assist in expelling the de-ionized water from the surface of the substrate. Dispensing nitrogen gas (N2) with the IPA or after dispensing the IPA from the channel 112 may assist in pushing the de-ionized water and IPA off the edge of the substrate. The circular plate 110 may be positioned at a lowered position to confine the treatment fluid (IPA and/or N2) between the circular plate 110 and the substrate 102. In certain embodiments, the circular plate 110 may be rotated, such as in unison with the substrate 102 or at a different speed than the substrate 102.

In FIG. 5C, the heater 130 is positioned in an upper position in contact with the substrate 102 to heat the substrate 102 to a desired temperature. Remaining IPA on the substrate 102 is vaporized due to the heating of the substrate 102. Vaporizing the remaining IPA on the substrate 102 removes the IPA and hence dries the substrate 102. The holding members 140 of the spin chuck may be positioned in a substrate unclamped position to aid in uniform vaporization of the IPA. For example, the heater 130 may be set to a heater temperature in a range from about 40 degrees Celsius to about 70 degrees Celsius to provide a substrate temperature in a range from about 30 degrees Celsius to about 60 degrees Celsius to vaporize remaining IPA on the substrate 102. If a vacuum is applied within the substrate processing apparatus 100, a lower heater temperature may be used. In other embodiments, higher or lower heater temperatures and substrate temperatures may be used.

The substrate 102 may undergo a purging process to assist in removal of the de-ionized water, particles, debris, contaminants, and IPA. In a purging process, a purge gas, such as nitrogen gas (N2), is sprayed or dispensed by the one or more channels 112 of the circular plate onto the substrate 102 to substantially remove de-ionized water, particles, debris, contaminants, and IPA from the substrate 102. The circular plate 110 may be lowered towards the substrate 102 to retain the purge gas between the circular plate 110 and the substrate 102 to assist in the lateral movement of de-ionized water, particles, debris, contaminants, and towards and off the edge of the substrate 102. Examples of purge gases include nitrogen, argon, helium, IPA vapor, air, other inert gases, and their mixtures.

Without being bound by theory unless specifically set forth in the claims, the substrate 102 is held by the holding members 140 in which each holding member 140 includes a pin having a sloped portion. The sloped portion of the pin reduces capillary action of the treatment fluid dispensed at FIG. 5A and/or FIG. 5B and helps maintain the thickness of the treatment fluid at the upper edge 108 of the substrate 102 near the holding member 140. Holding members 140 including pins having sloped portions provides a more uniformly cleaned and dried substrate 102 with reduced pattern collapse of features formed over the substrate.

Treatment fluid 104 has been described in reference to the method 400 of FIG. 4 and in the method of cleaning and drying a substrate in FIGS. 5A-5C as de-ionized water followed by IPA. Other treatment fluids 104 may be used to process the substrate, such as to etch, strip, clean, and/or dry a substrate 102. For example, treatment fluids 104 includes IPA (isopropyl alcohol), deionized water, NH4OH, KOH, TMAH (tetramethylammonium hydroxide), TBAH (tetrabutylammonium hydroxide), H2O, NH4OH/H2O2/H2O, NH4OH/H2O, HCl/H2O2/H2O, HCl/H2O, H2O4/H2O2, HF/H2O, HF/H2O2/H2O, HF/NH4/H2O, acetic acid, HNO3/H2O, HNO3/HCl/H2O, H3PO4/H2O, the like, or any mixture or combination thereof. One or more treatment fluids may be dispensed onto the substrate in one or more processes.

Figure 6:
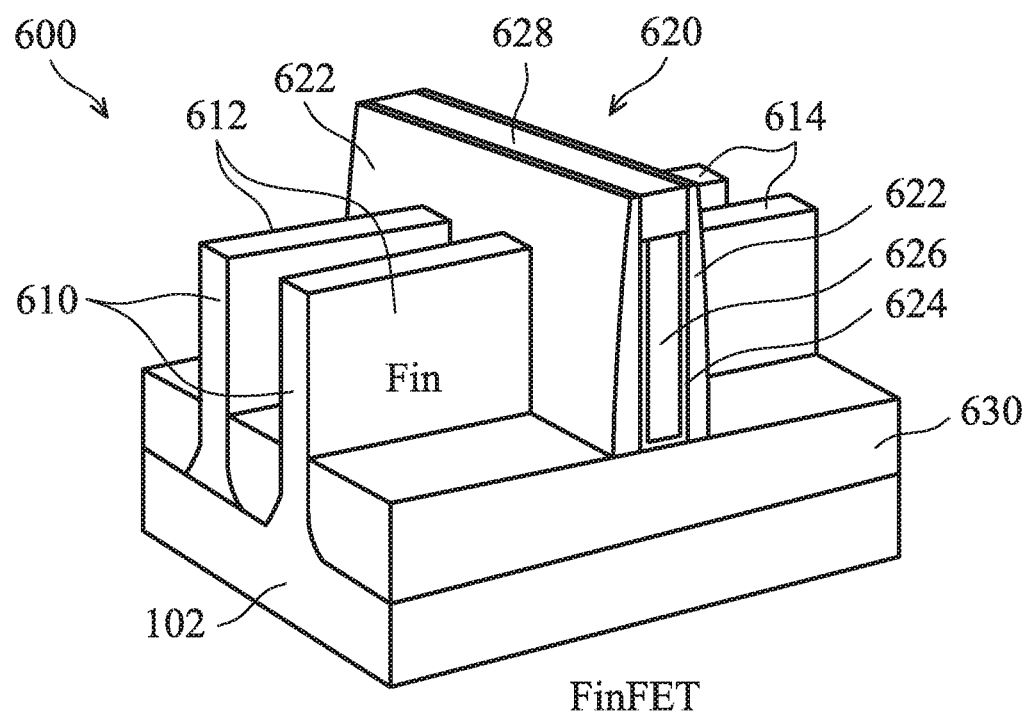
FIG. 6 is a partial perspective view illustrating a substrate having a FinFET device formed thereover, in accordance with some embodiments.

The substrate processing apparatus 100 and the spin chuck 120 may be used to process features used to form advanced semiconductor devices. The substrate processing apparatus 100 and the spin chuck 120 may be used to clean and dry substrates in the manufacture of FinFET devices, such as the FinFET device 600 shown in FIG. 6. FIG. 6 is a partial perspective view illustrating one embodiment of a substrate 102 having a FinFET device 600 formed thereover. The FinFET device 600 includes gate structure 620 formed over two fins 610 having source/drain regions 612 and source/drain regions 614. A shallow trench isolation 630 separates active regions, e.g., fins 610. The gate structure 620 includes sidewall spacers 622, a gate dielectric 624, a gate 626, and a mask 628. Particles may reside at the bottom of the fins 610 of FinFET device 600 due to a high aspect ratio trench between the fins. The fins 610 may also be prone to collapse due to capillary action between the fins 610. The substrate processing apparatus 100 and the spin chuck 120 may be used to more thoroughly and more uniformly clean and dry the fins 610 of FinFET device 600 by providing more uniform treatment fluid over the substrate and at the upper edge 108 of the substrate.

The substrate processing apparatus 100 and the spin chuck 120 may be used in cleaning and drying after a number of semiconductor manufacturing steps. For example, the substrate processing apparatus 100 and the spin chuck 120 may be used after the deposition of films, such as after chemical vapor deposition, physical vapor deposition, epitaxial deposition, or electrodeposition of films; after the chemical mechanical polishing removal of material layers; after etching to form features within or over a substrate; and other manufacturing steps of semiconductor devices.

Figure 7A:
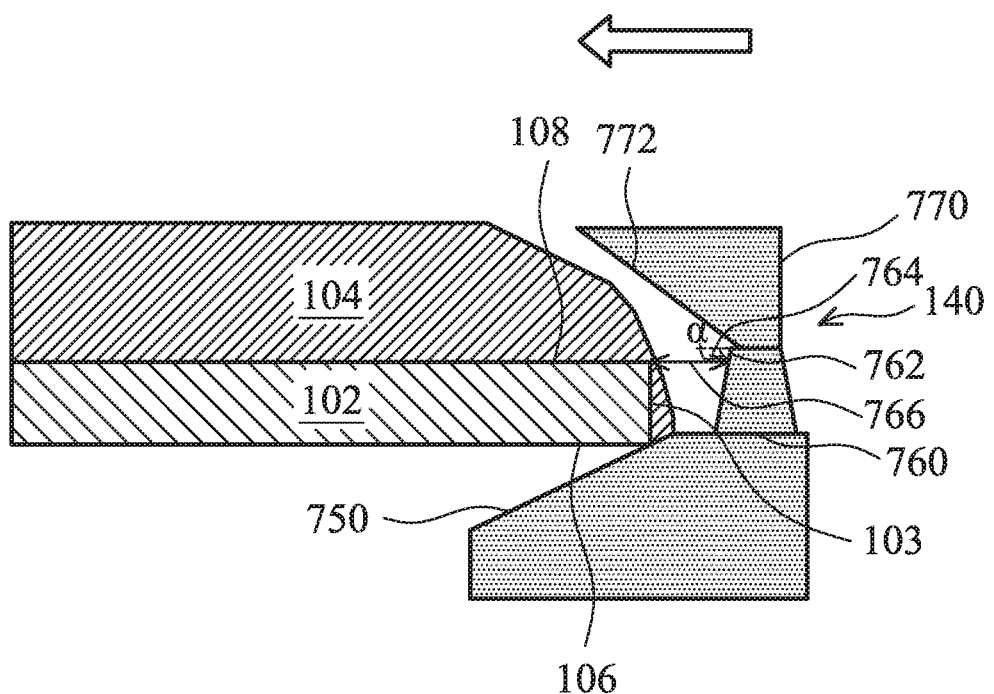
FIGS. 7A and 7B are schematic diagrams of respective cross-sectional views of another holding member of FIG. 1, in accordance with some embodiments.
Figure 7B:
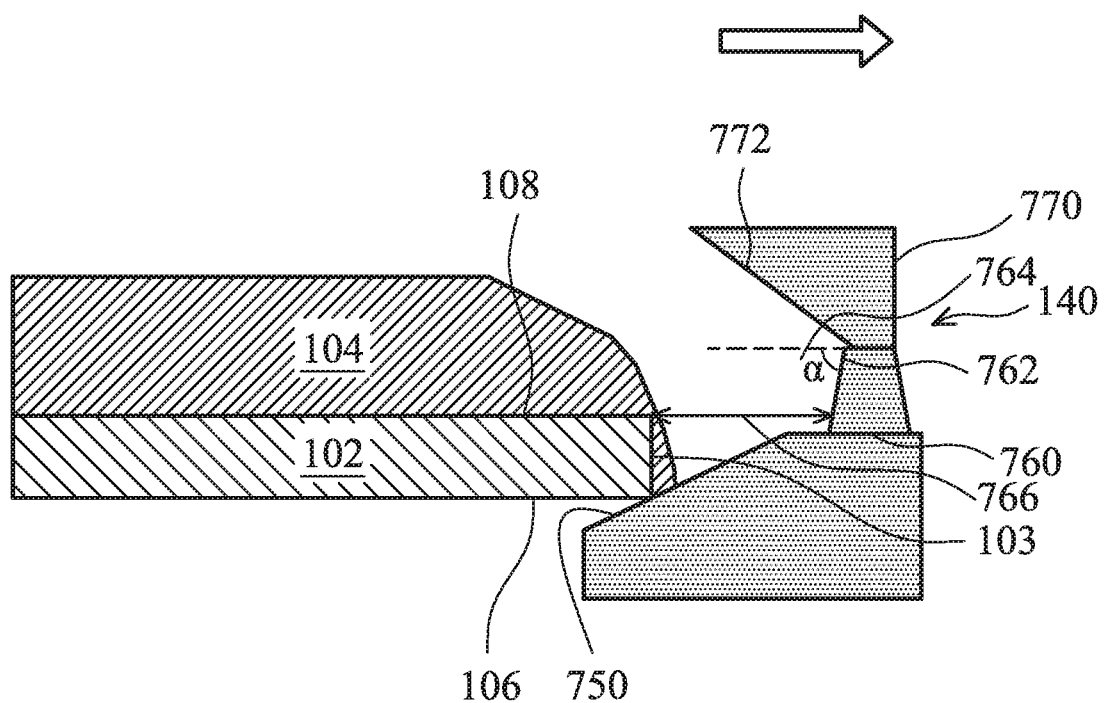

FIGS. 7A and 7B are schematic diagrams of cross-section views of another embodiment of the holding member 140 of FIG. 1. The holding member 140 includes a support portion 750 to support the bottom edge 106 of the substrate 102. The support portion 750 may be angled (as shown) or may be flat. The holding member 140 includes a pin 760 supporting a holding clamp 770.

FIG. 7A shows the holding member 140 actuated in a substrate clamped position by positioning the holding clamp 770 towards the substrate 102. The holding clamp 770 is moved laterally towards the center of the substrate 102 so that a clamping portion 772 contacts or is proximate to an upper edge 108 of the substrate 102. FIG. 7B shows the holding member 140 actuated in a substrate unclamped position by positioning the holding clamp 770 away from the center of the substrate 102. The holding clamp 770 is moved laterally away from the substrate so that a clamping portion 772 is away from the upper edge 108 of the substrate 102.

The pin 760 of the holding member 140 includes a sloped portion 762 to provide a gap 766 between an upper edge 108 of the substrate 102 and the pin 760. In certain embodiments, the angle 764 of the sloped portion 162 is between 45 degrees and 89 degrees. In other embodiments, the angle 764 of the sloped portion is between 50 degrees and 80 degrees. The sloped portion 762 of the holding member 140 improves the thickness of the treatment fluid 104, such as IPA, at the upper edge 108 of the substrate 102 near the holding member 140.

The holding member 140 may be mounted on an arm to position the holding member between a substrate clamped position and a substrate unclamped position. The arm may be a linear arm and/or pivot arm to laterally move the holding member 140. The holding member 140 may reduce the occurrence of substrate defects (particles, residues, pattern collapse) due to the improved thickness of a treatment fluid 104 proximate the holding member 140.

Embodiments described herein have positioned the substrate in a horizontal position. In other embodiments, the substrate may be positioned in a tilted position or a vertical position. Embodiments described herein dispense deionized water and IPA in the same substrate processing apparatus. In other embodiments, a plurality of substrate processing apparatuses may be used to separately dispense deionized water and IPA. Embodiments also include dispensing treatment fluid at different directions, angles, positions and by using different nozzles, channels, and inlet. The nozzles, channels, and inlets may be stationary during dispensing or moving during dispensing.

Embodiments described herein provide a holding member to hold a substrate with a treatment fluid dispensed over the substrate. The holding members hold the substrate while permitting more uniformity in the thickness of the treatment fluid dispensed over the substrate. Since thickness of the treatment fluid may be maintained more uniformly over the substrate, the treatment fluid may more uniformly clean and/or dry the substrate resulting in reduced substrate defects, such as reduced contamination and reduced pattern collapse.

In one embodiment, an apparatus for drying a substrate includes a spin chuck and a treatment fluid delivery apparatus disposed over the spin chuck. The spin chuck includes a plurality of holding members coupled to a spin base and a rotation mechanism to rotate the spin base. Each holding member includes a pin having a sloped portion.

In another embodiment, a spin chuck for drying a substrate includes a plurality of holding members coupled to a spin base and a rotation mechanism coupled to the spin base. The spin chuck further includes a heater to heat the substrate. Each holding member includes a pin having a sloped portion.

In yet another embodiment, a method of processing a substrate includes holding the substrate on a spin chuck with a plurality of holding members. Each holding member includes a pin having a sloped portion. De-ionized water is dispensed over the substrate, and isopropyl alcohol is disposed over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing a substrate, comprising:
holding the substrate on a support portion of a spin chuck with a plurality of holding members, each holding member comprising a pin and a clamping portion, the pin being attached to the support portion, the pin having a sloped portion to provide a gap between an upper edge of the substrate and the sloped portion of the pin, wherein the gap continuously increases from a lower surface of the pin to an upper surface of the pin, wherein holding the substrate comprises rotating the clamping portion relative to the pin, the clamping portion extending over an upper surface of the substrate; and
dispensing a first treatment fluid over the substrate; and
dispensing a second treatment fluid over the substrate.

2. The method of claim 1, further comprising heating the substrate to vaporize the dispensed second treatment fluid from the substrate.

3. The method of claim 2, wherein the substrate is rotated during the dispensing the first treatment fluid.

4. The method of claim 2, wherein the substrate is rotated during the dispensing the second treatment fluid.

5. The method of claim 1, wherein the first treatment fluid comprises de-ionized water and wherein the second treatment fluid comprises isopropyl alcohol.

6. The method of claim 1, wherein holding the substrate comprises holding the substrate above a heater.

7. A method of processing a substrate, comprising:

placing the substrate on a spin chuck;

securing the substrate on the spin chuck with a holding mechanism, the holding mechanism comprising a support portion, a clamping portion and a pin, wherein the substrate contacts the support portion, wherein the pin attaches the clamping portion to the support portion, wherein the pin has a sloped sidewall such that a distance between the substrate and the sloped sidewall of the pin continuously increases as a distance from the support portion increases, wherein securing the substrate comprises rotating the clamping portion relative to the support portion;

dispensing a first treatment fluid over the substrate; and dispensing a second treatment fluid over the substrate.

8. The method of claim 7, wherein securing the substrate comprises rotating the pin.

9. The method of claim 7, wherein securing the substrate comprises rotating the clamping portion relative to the pin.

10. The method of claim 7, wherein securing the substrate comprises moving the holding mechanism laterally towards the substrate.

11. The method of claim 7 further comprising heating the substrate after dispensing the first treatment fluid.

12. The method of claim 11 further comprising unsecuring the substrate while heating the substrate.

13. The method of claim 7, wherein the sloped sidewall is curved.

14. A method of processing a substrate, comprising:

clamping the substrate to a spin chuck using a plurality of holding members coupled to a spin base, each holding member comprising a pin, a holding clamp coupled to the pin, and a support base coupled to the pin, wherein the pin has a sloped sidewall, wherein an entirety of a sidewall of the pin is spaced apart from the substrate, wherein a first distance between the substrate and a lowermost sidewall of the pin is less than a second distance between the substrate and an upper sidewall of the pin, wherein the holding clamp rotates independently of the support base;

rotating the spin chuck;

dispensing one or more treatment fluids over the substrate; and heating the substrate, the heating vaporizing at least one of the one or more treatment fluids.

15. The method of claim 14, wherein heating the substrate comprises raising a heating element towards the substrate.

16. The method of claim 14, wherein attaching the substrate comprises rotating the holding clamp about the pin.

17. The method of claim 14, wherein attaching the substrate comprises rotating the pin.

18. The method of claim 14 further comprising stopping rotation of the spin chuck prior to heating the substrate.

19. The method of claim 18 further comprising unclamping substrate from the plurality of holding members prior to heating the substrate.

20. The method of claim 14, wherein the substrate comprises a fin structure.

* * * * *